(12) United States Patent
Darden et al.

(10) Patent No.: US 7,725,850 B2
(45) Date of Patent: May 25, 2010

(54) METHODS FOR DESIGN RULE CHECKING WITH ABSTRACTED VIA OBSTRUCTIONS

(75) Inventors: Laura R. Darden, Essex Junction, VT (US); William J. Livingstone, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 11/830,255

(22) Filed: Jul. 30, 2007

(65) Prior Publication Data

US 2009/0037857 A1 Feb. 5, 2009

(51) Int. Cl.
*G06F 17/50* (2006.01)
*H03K 17/693* (2006.01)
*H01L 23/48* (2006.01)

(52) U.S. Cl. ............... 716/5; 716/2; 716/7; 716/10; 716/11; 716/14; 716/15; 257/774

(58) Field of Classification Search ............ 716/2, 716/5, 6, 9–11, 13–15; 257/758, 774; 438/239, 438/597; 365/185.17
See application file for complete search history.

(56) References Cited

U.S. PATENT DOCUMENTS

| | | | | |
|---|---|---|---|---|
| 6,026,224 | A * | 2/2000 | Darden et al. ............... | 716/10 |
| 6,275,971 | B1 * | 8/2001 | Levy et al. ................ | 716/5 |
| 6,487,706 | B1 * | 11/2002 | Barkley et al. ............. | 716/7 |
| 6,505,333 | B1 * | 1/2003 | Tanaka .................... | 716/13 |
| 6,760,897 | B2 * | 7/2004 | Arakawa et al. ............ | 716/13 |
| 6,789,246 | B1 * | 9/2004 | Mohan et al. .............. | 716/11 |
| 6,895,568 | B2 * | 5/2005 | Li ........................ | 716/10 |
| 7,007,258 | B2 * | 2/2006 | Li ........................ | 716/9 |
| 7,065,721 | B2 * | 6/2006 | Pekin et al. .............. | 716/2 |
| 7,134,111 | B2 * | 11/2006 | Nakamoto ................. | 716/10 |
| 7,340,711 | B2 * | 3/2008 | Hetzel et al. ............. | 716/14 |
| 7,380,227 | B1 * | 5/2008 | Li ........................ | 716/5 |
| 7,498,250 | B2 * | 3/2009 | Dunham et al. ............ | 438/597 |
| 7,519,929 | B2 * | 4/2009 | Li ........................ | 716/5 |
| 7,543,263 | B2 * | 6/2009 | Kitamura ................. | 716/13 |
| 7,565,638 | B2 * | 7/2009 | Hoerold .................. | 716/18 |
| 2003/0080435 | A1 | 5/2003 | Dunham et al. | |
| 2004/0063228 | A1 | 4/2004 | Li et al. | |
| 2005/0280159 | A1 * | 12/2005 | Okumura ................. | 257/774 |
| 2006/0036986 | A1 | 2/2006 | Darden et al. | |
| 2006/0081988 | A1 | 4/2006 | Dunham et al. | |
| 2007/0044061 | A1 * | 2/2007 | Nakamoto ................. | 716/13 |
| 2007/0072361 | A1 * | 3/2007 | Tu et al. ................. | 438/239 |
| 2007/0101303 | A1 * | 5/2007 | Lien et al. ............... | 716/5 |
| 2007/0262454 | A1 * | 11/2007 | Shibata ................... | 257/758 |
| 2008/0074929 | A1 * | 3/2008 | Shiga et al. .............. | 365/185.17 |
| 2008/0127020 | A1 * | 5/2008 | Rittman .................. | 716/10 |

* cited by examiner

*Primary Examiner*—Helen Rossoshek
(74) *Attorney, Agent, or Firm*—Wood, Herron & Evans, LLP

(57) ABSTRACT

Methods of treating via obstructions during design rule checking. The method comprises examining the size of the via obstruction with respect to a minimum size and a minimum spacing constraint of a design rule. Based upon the comparison, a neighboring via count for a number of via shapes neighboring the via obstruction may be initialized to equal a positive integer. Based upon the comparison, the via obstruction may be represented with a plurality of smaller via shapes during design rule checking.

11 Claims, 4 Drawing Sheets

METHODS FOR DESIGN RULE CHECKING WITH ABSTRACTED VIA OBSTRUCTIONS

FIELD OF THE INVENTION

The invention relates generally to integrated circuit fabrication and, in particular, to methods for design rule checking in integrated circuit designs including abstracted via obstructions.

BACKGROUND OF THE INVENTION

Automated design systems are commonly used to layout and design integrated circuits and, in particular, to design back end of line (BEOL) interconnect structures. A design rule checker is employed by the design system to verify that the layout of the BEOL complies with mandated design rules. Design rule spacing constraints are imposed in BEOL interconnect structures on spacings for troughs in the dielectric material of different metallization levels (i.e., Mx-levels), which are filled by metal lines, and on spacings for vias in the dielectric material of different via layers (i.e., Vx-layers), which are filled by metal plugs that supply vertical interconnections between adjacent Mx-levels. The actual shapes for the troughs and vias are represented to the design rule checker as design shapes, such as rectangles and squares.

Design rules may be supplied to the design rule checker that limit the number and spacing of nearest neighbor via cuts or shapes in the Vx-layers. For example, a design rule may constrain the number of nearest neighbor via shapes that are permitted within a given center-to-center distance of any other arbitrary via shape. When actual via shapes are known, design rules on the number and spacing of nearest neighbor via shapes are relatively simple to implement when the integrated circuit is designed. However, the design rule checker may encounter difficulties if multiple discrete via shapes have been abstracted into a shape element known as a via obstruction (e.g., cores, technology library, via level abstraction, hierarchical objects). Specifically, the locations of the actual via shapes contained within the via obstruction are unknown to the design rule checker. In addition, the center of the via obstruction may not be the true center of a via shape within the via obstruction. Consequently, the design rule checker may not be able to accurately verify whether or not the relation between the via obstruction and other via shapes complies with the design rules.

Consequently, methods are needed that permit the design rule checker to comply with design rules on the spacing among nearest neighbor via shapes in Vx-layers when analyzing via shapes having the abstracted form of via obstructions.

SUMMARY OF THE INVENTION

Embodiments of the invention are generally directed to methods of treating via obstructions during design rule checking. In one specific embodiment, the method comprises examining a size of the via obstruction with respect to a minimum size and a minimum spacing constraint of a design rule. The method further comprises, based upon the comparison, initializing a neighboring via count for a number of via shapes neighboring the via obstruction to equal a positive integer. The method may further comprise representing the via obstruction with a plurality of smaller via shapes during design rule checking.

In another specific embodiment, the method comprises comparing at least one dimension of the via obstruction relative to a minimum size and a minimum spacing constraint of a design rule. The method further comprises, based upon the comparison, representing the via obstruction with a plurality of smaller via shapes during design rule checking.

DETAILED DESCRIPTION

With reference to FIGS. 1, 2, 3, 4, 4A, 4B, and 5, a procedure is provided that permits a design rule checker to analyze abstracted via obstructions in the context of a scan line algorithm (also know as a plane sweep algorithm) in order to comply with design rule constraints on the number, VxMinNeighborLimit, of neighboring Vx-layer via shapes. Neighboring via shapes are defined as being via shapes within a center-to-center distance, VxMinNeighborSpace, of each other. Via shapes are characterized in the design rule by a minimum via dimension, VxDim, and by a minimum spacing, VxMinSpace, required between two adjacent or neighboring via shapes. Via obstructions are an abstraction of a set of legally spaced via shapes. As such, the sizes, counts, and locations of the via shapes contained within any arbitrary via obstruction are unavailable to the scan line algorithm of the design rule checker.

As a numerical example and for a 65 nm technology node, the design rule may set forth the minimum spacing (i.e., VxMinSpace) of 0.1 microns between via shapes of minimum via dimension 0.1 microns (i.e., VxDim). The design rule may further constrain, if more than three via shapes are present as VxNeighborLimit, the minimum spacing measured center-to-center between these via shapes (i.e., VxMinNeighborSpacing) must be at least 0.25 microns. In other words, an arbitrary via shape may have two neighboring via shapes within 0.1 microns distance, measured edge-to-edge, but a third neighboring via shape is prohibited under the design rule unless the third neighboring via shape is located at least a distance of 0.25 microns, measured center-to-center, from the arbitrary via shape.

Figure 1:
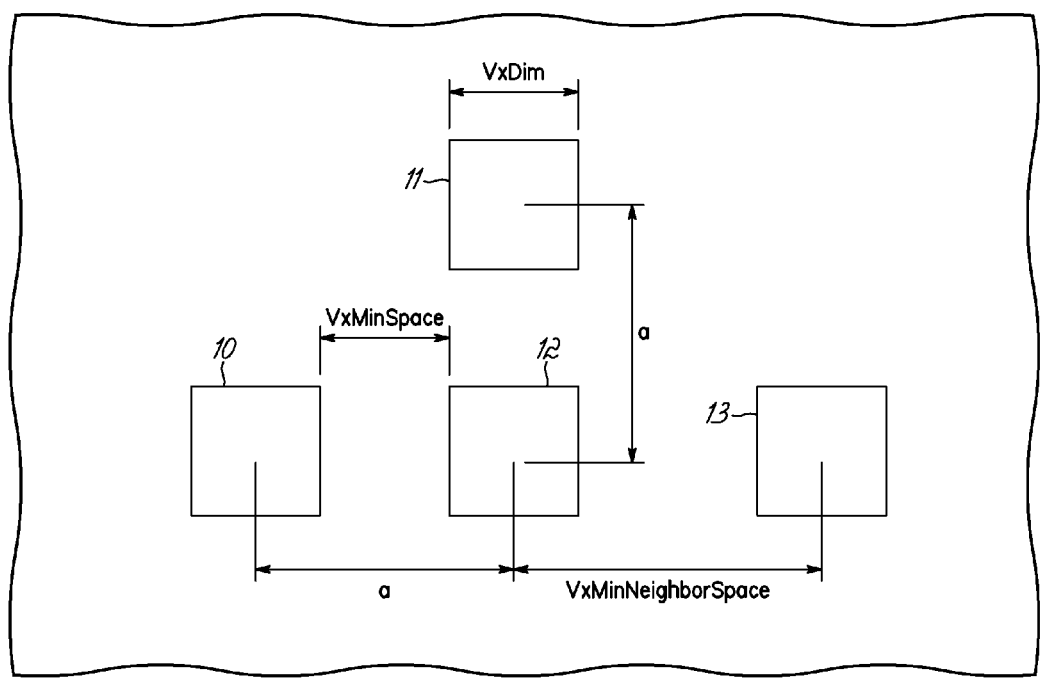
FIG. 1 is a diagrammatic view of four neighboring via shapes in a Vx-layer.

With reference to FIG. 1, via shapes 10, 11, 12, and 13 each have dimensions VxDim. Via shape 12 is separated by VxMinSpace from via shape 10. Via shape 12 is also separated by VxMinSpace from via shape 11. Via shapes 10 and 12 and via shapes 11 and 12 are separated by a center-to-center distance, a, equal to the sum of VxDim and VxMinSpace (i.e., VxDim+VxMinSpace). Because the center-to-center distance, a, is less than VxMinNeighborSpace, via shape 12 has two (2) via shape neighbors (i.e., via shape 10 and via shape 11) within VxMinNeighborSpace. In other words, three (3), VxNeighborLimit, via shapes (i.e., via shapes 10, 11, and 12) are within VxMinNeighborSpace. To meet the design rule requiring no more than three (3) via shapes within VxMinNeighborSpace when measured center-to-center relative to each other (i.e, VxNeighborLimit=3), the center of via shape 13 must be located at least VxMinNeighborSpace from the center of via shape 12. As a numerical example for a 65 nm technology node, VxDim is equal to 0.1 microns, VxMinSpace is equal to 0.1 microns, a is equal to 0.2 microns and VxMinNeighborSpace is equal to 0.25 microns.

Initially, for each Vx-layer, via shapes are gathered and a neighboring via counter is associated with each via shape and initialized to zero (0). For each Vx-layer, via obstructions are gathered, and the dimensions of each via obstruction are examined to determine how to model the via obstruction as one or more via shapes during the scan line processing. For each via obstruction, either the obstruction shape or a set of via shapes is used to model the via obstruction. For each via shape used to model the via obstruction, a neighboring via counter is established and initialized. The modeling of via obstructions with via shapes based upon the dimensions of the via obstruction is described in detail hereinbelow. Once the shapes and counters are established, the shapes are sorted, and a scan line rectangle intersection algorithm is used to increment the neighboring via counters of each shape whenever two shapes are detected by the scan line algorithm to be within the center-to-center distance VxMinNeighborSpace. If, upon incrementing a neighboring via counter, the counter meets or exceeds a threshold neighbor limit, VxMinNeighborLimit, the checking algorithm reports an error that indicates a violation of the design rule.

As mentioned above and described in detail below, the via obstructions are gathered for each Vx-layer as part of the design rule checking process. The gathered via obstructions are optionally modeled contingent upon the dimensions. If the dimensions of the via obstruction are both at least (2·VxDim+VxMinSpace), the obstruction shape is used without modification in the scan line processing, and the neighboring via counter for the obstruction shape is initialized to two (2). If the dimensions of the via obstruction are both less than (VxDim+VxMinSpace), the obstruction shape is used without modification in the scan line processing, and the neighboring via counter for the obstruction shape is initialized to zero (0). If the larger of the dimensions of the via obstruction is exactly such that a number n, where n>1, of via shapes with dimension VxDim separated by VxMinSpace will exactly fit within the via obstruction, the via obstruction is replaced by the number, n, of via shapes (which model the via obstruction) and each of these replacement via shapes is assigned a neighboring via counter initialized to zero (0). If none of these dimensional relationships applies, the via obstruction is replaced by three smaller rectangular via shapes (which model the via obstruction) and the neighboring via counter for each of these replacement via shapes is initialized to zero (0).

Figure 2:
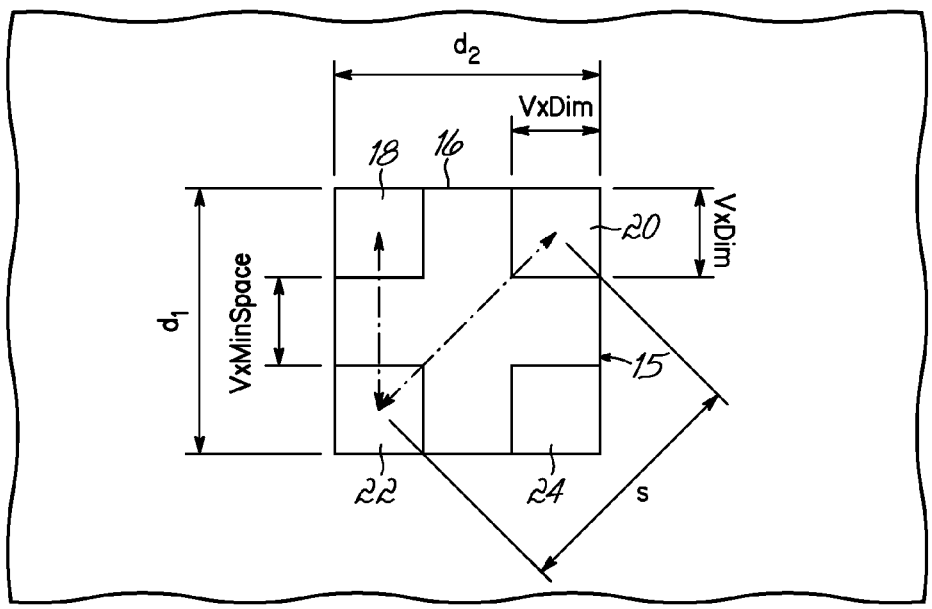
FIG. 2 is a diagrammatic view of a via obstruction containing multiple via shapes.

With reference to FIG. 2, a representative first type of via obstruction 15 is depicted that could be encountered in one of the Vx-layers when gathering the via obstructions. Via obstruction 15 is characterized by an outer perimeter 16 of first and second rectangular dimensions $d_1$ and $d_2$ that are both greater than or equal to the sum of two times the minimum dimension, VxDim, of the particular Vx-layer and the minimum spacing, VxMinSpace, of the particular Vx-layer [i.e., 2·VxDim+VxMinSpace]. Because of its relatively large size, the via obstruction 15 is assumed to contain at least a two by two (2×2) array of abstracted via shapes, which are modeled as via shapes 18, 20, 22, and 24.

The specific locations of via shapes 18, 20, 22, and 24 are inside the outer perimeter 16 is unknown to, and therefore hidden from, the checking algorithm. However, via shape 18 and via shape 24 can be within the center-to-center distance VxMinNeighborSpace of via shape 22, assuming the third via neighbor to via shape 22, that is via shape 20, is separated from via shape 22 by a center-to-center distance, s, that is at least VxMinNeighborSpace. In this instance, via shape 22 has two neighboring via shapes, namely via shapes 18 and 24, within VxMinNeighborSpace.

Because the dimensions of via obstruction 15 are both at least (2·VxDim+VxMinSpace), the obstruction shape is used without modification in the scan line processing. The neighboring via counter for the obstruction shape is initialized to two (2) in recognition that the via obstruction 15 contains a cluster of via shapes in close proximity with one another, each with the potential for two neighbors contained within the via obstruction 15. In this instance, when the scan line algorithm detects another shape within the distance VxMinNeighborSpace of via obstruction 15, the neighboring via counter associated with via obstruction 15 will numerically increment to the value three (3). If this meets or exceeds the nearest neighbor limit, an error will be reported.

Figure 3:
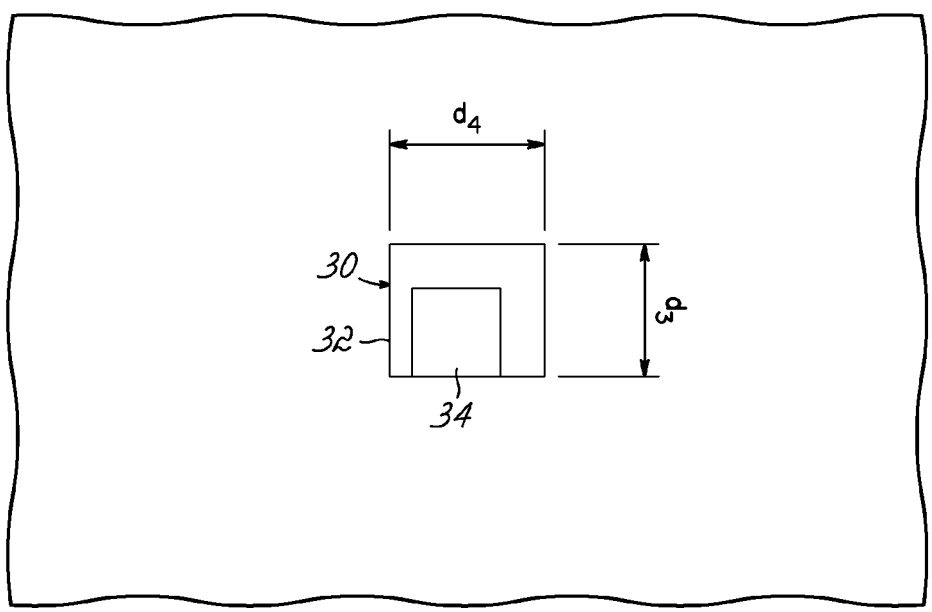
FIG. 3 is a diagrammatic view of a via obstruction containing a single via shape.

With reference to FIG. 3, a representative second type of via obstruction 30 is depicted that could be encountered in one of the Vx-layers when gathering the via obstructions. Via obstruction 30 is characterized by an outer perimeter 32 of first and second rectangular dimensions, $d_3$ and $d_4$, that are both less the sum of VxDim and VxMinSpace. Because of its relatively small size, the via obstruction 30 cannot contain more than one via shape 34 of VxDim. However, the precise location of the via shape 34 within the via obstruction 30 is unknown to the checking algorithm. In this instance, when both dimensions, $d_3$ and $d_4$, are less than (VxDim+VxMinSpace), the obstruction shape is used without modification in the scan line processing, and the neighboring via counter is initialized to zero (0).

Figure 4:
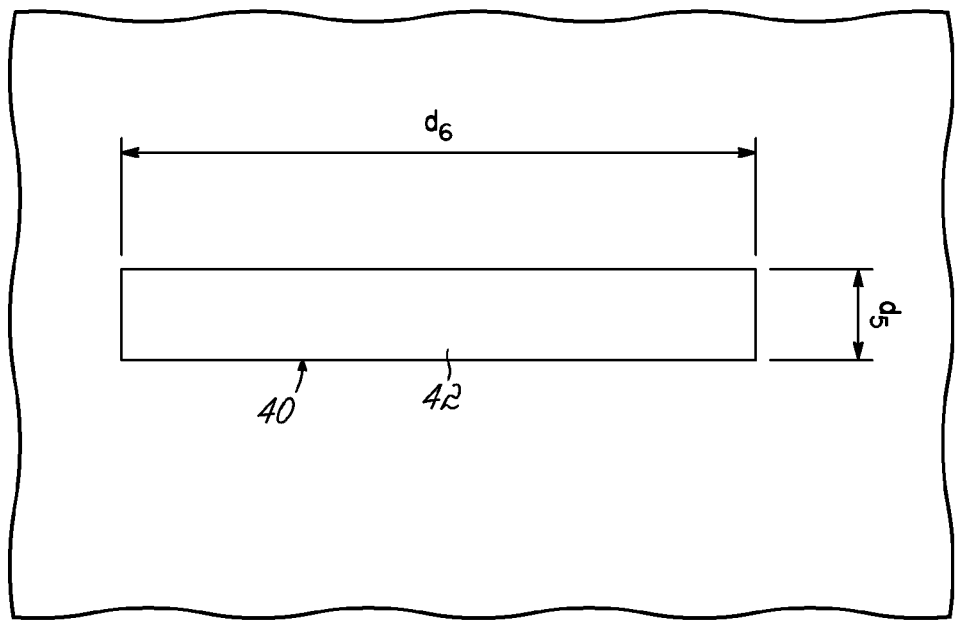
FIG. 4 is a diagrammatic view of an oblong via obstruction containing an unknown number of via shapes.
Figure 4A:
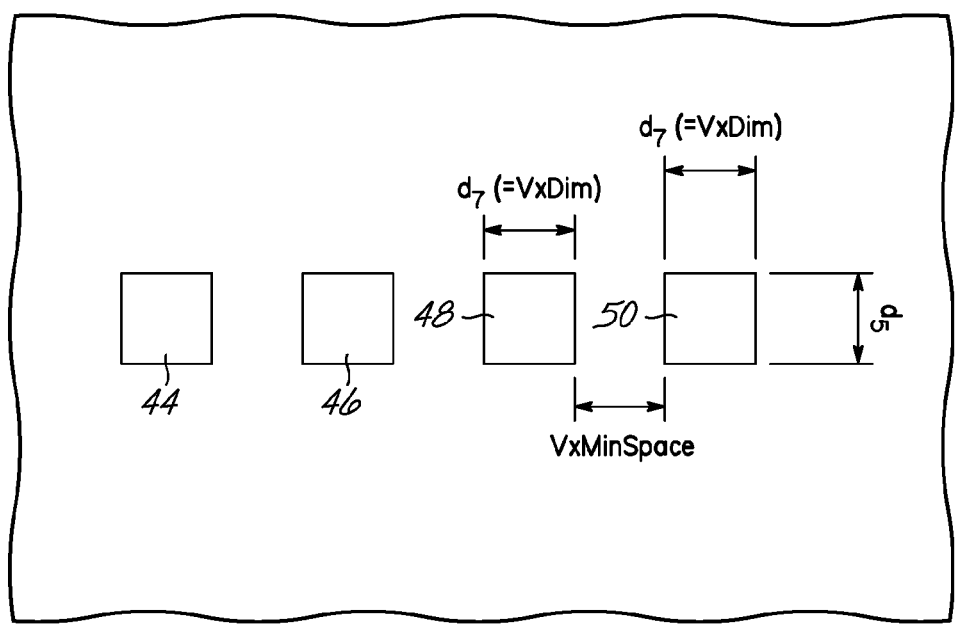
FIG. 4A is a diagrammatic view of smaller replacement shapes that can be used to represent the via obstruction of FIG. 4.
Figure 4B:
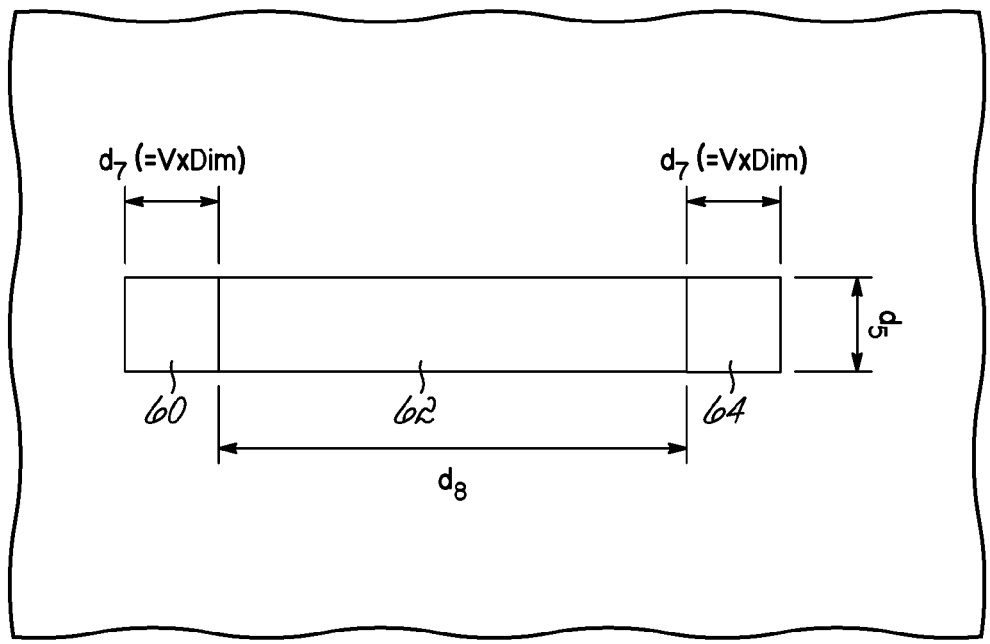
FIG. 4B is a diagrammatic view of smaller replacement shapes that can be used to represent the via obstruction of FIG. 4.

With reference to FIGS. 4, 4A, and 4B, a representative third type of via obstruction 40 is depicted that could be encountered in one of the Vx-layers. Via obstruction 40 is characterized by an outer perimeter 42 of first and second rectangular dimensions $d_5$ and $d_6$ in which $d_5$ is smaller than $d_6$.

If $d_6$, which is the larger of the first and second rectangular dimensions of via obstruction 40, is exactly equal to the product of a positive integer, n, where n>1, times VxDim added to the integer, n, decremented by one and multiplied by VxMinSpace [i.e., n·VxDim+(n−1)·VxMinSpace, where n>1], the via obstruction 40 is replaced by a number, n, of smaller rectangular via shapes 44, 46, 48, 50, as shown in FIG. 4A. One dimension of each of the smaller rectangular via shapes 44, 46, 48, and 50 is represented to be equal to $d_5$, which is the smaller of the first and second rectangular dimensions. The other dimension, $d_7$, of each of the smaller rectangular via shapes 44, 46, 48, and 50 is represented to be equal to VxDim. Along the other dimension, $d_6$, of the via obstruction 40, the separation between adjacent pairs of the smaller rectangular via shapes 44, 46, 48, and 50 is assigned to be equal to VxMinSpace.

In this instance, the smaller replacement via shapes 44, 46, 48, and 50 are used in the scan line processing as a replacement for the via obstruction 40 and the neighboring via counter associated with each of the via shapes 44, 46, 48, and 50 is initialized to zero (0). The subsequent scan line processing will detect neighboring via shapes 44 and 46, neighboring via shapes 46 and 48, and neighboring via shapes 48 and 50, and will increment the respective neighboring via counters accordingly. As a result, the counter values for via shapes 44 and 50 will each be at least one (1) and the counter values for via shapes 46 and 48 will each be at least two (2). If VxMinNeighborLimit is equal to three (3), via shapes 44 and 50 may have one additional neighboring via shape (not shown), but any additional neighboring via shape within VxMinNeighborSpace of the shapes 46 and 48 would be detected by the design rule checker as an error.

The dimensions, $d_5$ and $d_6$, of via obstruction 40 may both be less than (2·VxDim+VxMinSpace), may both be greater than (VxDim+VxMinSpace), and the greater of the dimensions, $d_5$ and $d_6$, of via obstruction 40 may not be equal to (n·VxDim+(n−1)·VxMinSpace), where n>1. In this instance and as a default action, the via obstruction 40 is replaced by three smaller rectangular via shapes 60, 62, and 64, as shown in FIG. 4B. Each of the via shapes 60, 62, and 64 used to model the via obstruction 40 has a neighboring via counter initialized to zero (0). Via shapes 60 and 64 are arranged on opposite ends of via shape 62. Each of the three smaller via shapes 60, 62, and 64 maintain the smaller dimension $d_5$ of the via obstruction 40. The other dimension, $d_7$, of the two smaller end rectangular via shapes 60 and 64 is equal to VxDim. Consequently, the other dimension, $d_8$, of the smaller middle rectangle via shape 62 is equal to $(d_6-2·d_7)$ or, equivalently, $(d_6-2·VxDim)$.

The subsequent scan line processing will detect neighboring via shapes 60 and 62, as well as neighboring via shapes 62 and 64, and will increment the neighboring via counters accordingly, such that the counter values for end via shapes 60 and 64 will be at least one (1), and the counter values for the middle via shape 62 will be at least (2). If the VxMinNeighborLimit is three (3), this allows for each end shape to have one additional neighboring via shape, but any additional neighboring via shape within VxMinNeighborSpace of the middle via shape 62 would be detected as an error during design rule checking.

The modeling of via obstruction 40, as described above with regard to FIG. 4A, by a set of n shapes may be replaced by the modeling of via obstruction 40, as described above with regard to FIG. 4B, by a set of three shapes. Modeling the via obstruction 40 as n shapes, when the dimensions are exact, may potentially provide a more accurate model.

In use, an arbitrary via obstruction is sequentially compared with the characteristics of via obstruction 15, the characteristics of via obstruction 30, and the two different types of characteristics for via obstruction 40. The arbitrary via obstruction shape is either used as is or, alternatively, is replaced by a set of via shapes modeling the via obstruction based on the result of the comparison. The neighboring via counters are associated with the via shapes and are initialized to a specific numerical value also based upon the result of the comparison.

The design rule may apply to all Vx-layers or, instead, to fewer than all of the Vx-layers, such as to only the lower Vx-layers.

Figure 5:
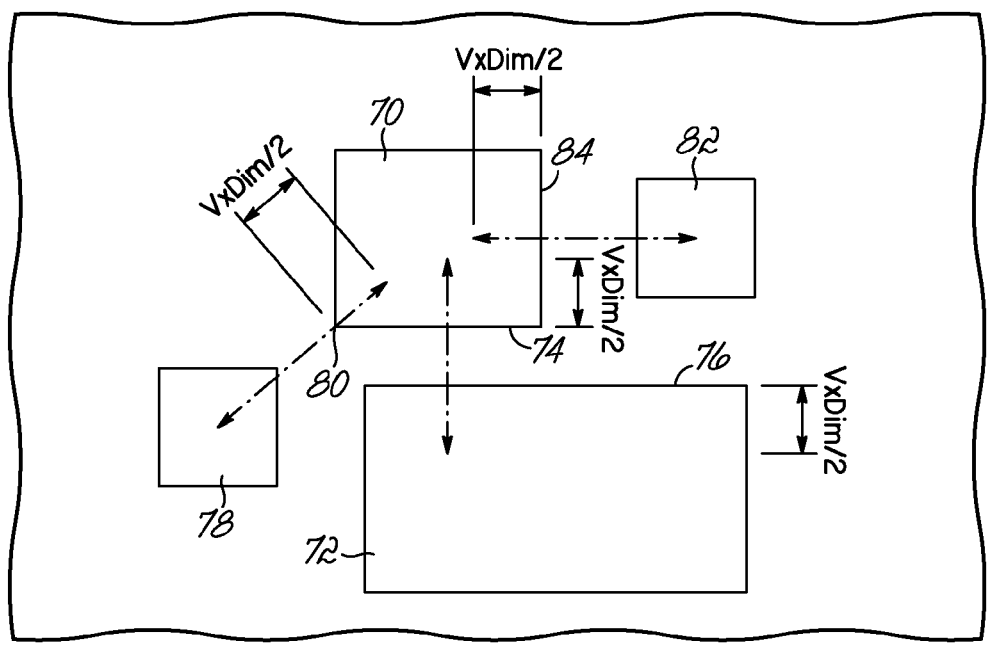
FIG. 5 is a diagrammatic view illustrating an approach for determining a center point of a via obstruction when executing a spacing check.

With reference to FIG. 5, the center point of an arbitrary via shape modeling a via obstruction or an arbitrary via obstruction 70 is needed for the center-to-center distance check associated with the design rule. The center point is determined based upon whether or not a second via shape under evaluation is another via obstruction or a shape modeling a via obstruction. If the second shape under evaluation is another via obstruction 72, the nearest edges 74 and 76 of both via obstructions 70 and 72, respectively, are found with respect to the other and the centers of the via obstructions 70 and 72 are calculated as (VxDim/2) from the respective edge 74 and 76. If the second shape under evaluation is not another via obstruction but instead is a non-abstracted via shape 78, then the nearest edge, such as corner edge 80, of the via obstruction 70 to the center of the via shape 78 are found with respect to the non-abstracted via shape actual center point and the obstruction center is calculated as (VxDim/2) from the corner edge 80. A similar determination is made with regard to via shape 82 with regard to the nearest edge 84. Via obstructions 70 and 72 may be via obstruction 15 (FIG. 2), via obstruction 30 (FIG. 3), one of the via shapes 44, 46, 48, or 50 (FIG. 4A), or one of the via shapes 60, 62, or 64 (FIG. 4B).

Using the method for implementing the design rule of the embodiments of the invention, any via obstruction having a size equal to or larger than a 2×2 array of via shapes will disallow another adjacent via shape. A via obstruction that is at least VxDim by (n·VxDim) or VxDim by (n·VxDim), wherein n is a positive integer (i.e., greater than 1), will allow one via shape adjacent to each end. However, via shapes are not permitted to be located adjacent to the via obstruction at a distance VxDim inward from each obstruction end.

When the neighboring via counter for a via obstruction reaches, or exceeds, the limit on adjacent via shapes, an error is only reported if a via shape that is not a via obstruction has contributed to the configuration that triggered an increment of the neighboring via counter. In other words, the algorithm ignores errors relating to the design rule governing VxNeighborLimit created only by adjacent via obstructions. A non-abstracted via shape must been involved in the neighboring via shape configuration for the algorithm to report an error.

This algorithm may be implemented in a graphical physical design editor, such as ChipEdit (International Business Machines Corporation, Armonk, N.Y.), executing on a programmable device, such as a general purpose computer, a special purpose computer, a microprocessor, an ASIC, or any other computing device having sufficient capabilities for implementing design rule checking consistent with the embodiments of the invention and any ancillary tasks.

The programmable device includes at least one processor (e.g., a microprocessor) coupled to a memory, which may represent random access memory (RAM) devices comprising a main storage device, as well as any supplemental levels of memory, e.g., cache memories, non-volatile or backup memories (e.g. programmable or flash memories), read-only memories, etc. In addition, the memory may be considered to include memory storage used as a virtual memory, e.g., as stored on a mass storage device or another computer coupled to the programmable device by a network. The programmable device receives a number of inputs and outputs for communicating information externally. As a user interface, the programmable device may include one or more user input devices (e.g., a keyboard, a mouse, a trackball, a joystick, a touchpad, a keypad, a stylus, and/or a microphone, among others) and a display (e.g., a CRT monitor, an LCD display panel, and/or a speaker, among others). The programmable device operates under the control of a kernel and operating system, and executes or otherwise relies upon various computer software applications, components, programs, objects, modules, data structures, etc.

In general, the routines executed to implement the embodiments of the invention, whether implemented as part of an operating system or a specific application, component, program, object, module or sequence of instructions, constitute a program code. The computer program code typically comprises one or more instructions resident at various times in various memory and storage devices in the programmable device, and that, when read and executed by one or more processors in the programmable device, causes that programmable device to perform the steps necessary to execute steps or elements embodying the various aspects of the embodiments of the invention. The various embodiments of the invention are capable of being distributed as a program product in a variety of forms using machine or computer readable media. Examples of computer readable media used for carrying out the distribution include, but are not limited to, physical, recordable type media such as volatile and non-volatile memory devices, floppy and other removable disks, hard disk drives, optical disks (e.g., CD-ROM's, DVD's, etc.), among others, and transmission type media such as digital and analog communication links.

It is understood that features of the embodiments of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising".

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A computer-implemented method of treating a via obstruction representing a plurality of shapes in a circuit design during design rule checking, the method comprising:
    comparing, using a computing device, at least one dimension of the via obstruction relative to a minimum size and a minimum spacing constraint of a design rule;
    initializing, using the computing device, a neighboring via count to a positive integer dependent upon a result of the comparison; and
    setting, using the computing device, a center point of the via obstruction at a distance measured inward from a nearest edge of the via obstruction proximate to one of a neighboring via shape or a neighboring via obstruction, wherein the distance is equal to one half of the minimum size.

2. The method of claim 1 further comprising:
    in response to the neighboring via shape being separated from the center point of the via obstruction by less than a minimum center-to-center distance, incrementing the neighboring via count.

3. The method of claim 2 further comprising:
    in response to the neighboring via obstruction being separated from the center point of the via obstruction by less than the minimum center-to-center distance, incrementing the neighboring via count.

4. The method of claim 3 further comprising:
    in response to the neighboring via count exceeding a nearest neighbor limit, reporting an error.

5. The method of claim 1 wherein the positive integer is equal to two.

6. The method of claim 1 wherein the neighboring via count is initialized to the positive integer if the via obstruction is dimensioned larger than two times the minimum size summed with the minimum spacing constraint.

7. A computer-implemented method of treating a via obstruction representing one or more shapes in a circuit design during design rule checking, the method comprising:
    comparing, using a computing device, at least one dimension of the via obstruction relative to a minimum size and a minimum spacing constraint of a design rule;
    based upon the comparison and using the computing device, representing the via obstruction with a plurality of via shapes that are smaller than the via obstruction during design rule checking; and
    setting, using the computing device, a center point of each of the via shapes at a distance measured inward from a nearest edge of the via obstruction proximate to one of a neighboring via shape or a neighboring via obstruction, wherein the distance is equal to one half of the minimum size.

8. The method of claim 7 further comprising:
    initializing a neighboring via count for each of the via shapes to zero.

9. The method of claim 8 further comprising:
    in response to the neighboring via shape being separated from the center point of one of the via shapes by less than a minimum center-to-center distance, incrementing the neighboring via count for the one of the via shapes.

10. The method of claim 9 further comprising:
    in response to the neighboring via obstruction being separated from the center point of one of the via shapes by less than the minimum center-to-center distance, incrementing the neighboring via count for the one of the via shapes.

11. The method of claim 10 further comprising:
    in response to the neighboring via count for any one of the via shapes exceeding a nearest neighbor limit, reporting an error.

* * * * *